United States Patent [19]
Steel
[11] 3,845,410
[45] Oct. 29, 1974

[54] CRYSTAL OSCILLATOR HAVING SPURIOUS OSCILLATION SUPPRESSION CIRCUIT

[75] Inventor: Francis R. Steel, Pompano Beach, Fla.
[73] Assignee: Motorola, Inc., Chicago, Ill.

[22] Filed: Oct. 9, 1973
[21] Appl. No.: 404,530

[52] U.S. Cl. .............................. 331/116 R, 331/105
[51] Int. Cl. .............................. H03b 5/36
[58] Field of Search .............................. 331/116, 105

[56] References Cited
UNITED STATES PATENTS

| | | | |
|---|---|---|---|
| 3,007,045 | 10/1961 | Paynter | 331/116 |
| 3,528,032 | 9/1970 | Tahmisian, Jr. | 331/116 |
| 3,569,865 | 3/1971 | Healey | 331/116 |
| 3,588,744 | 6/1971 | Rusho | 331/116 |

*Primary Examiner*—John Kominski
*Attorney, Agent, or Firm*—Eugene A. Parsons; Vincent J. Rauner

[57] ABSTRACT

A frequency modulated crystal controlled overtone oscillator including a resistance-inductance network for minimizing spurious responses. The resistance shunts a low impedance point, thereby providing minimal loss at the desired frequency, but provides dissipation to prevent oscillation at spurious frequencies at which the impedance of the low impedance point rises.

9 Claims, 1 Drawing Figure

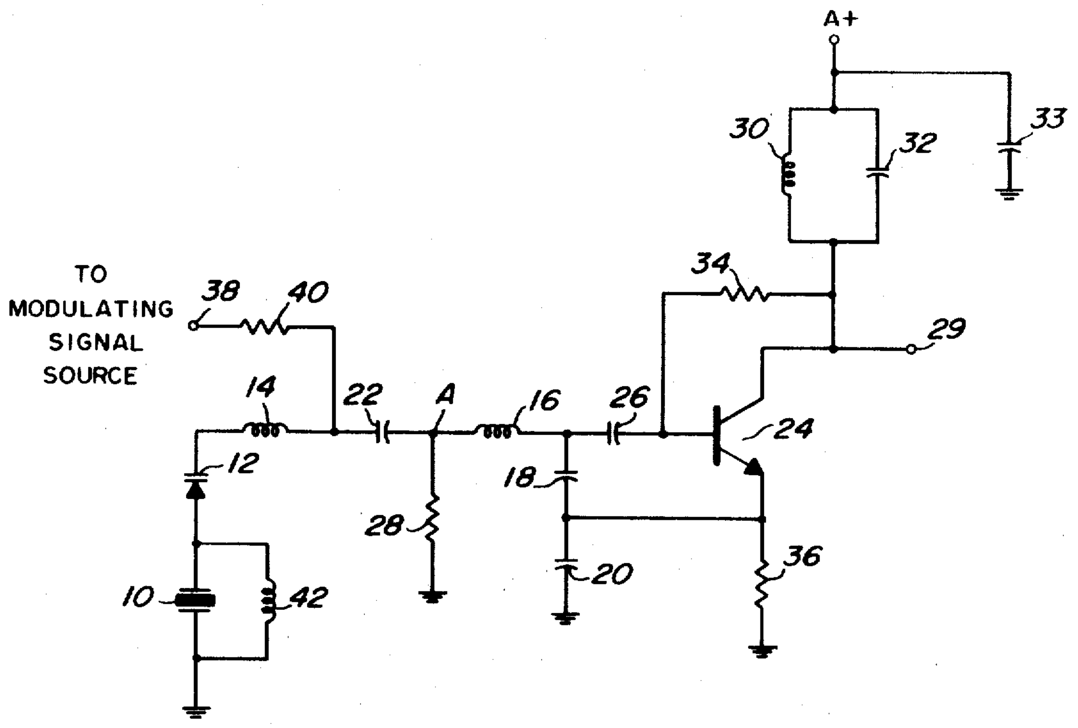
A+
30
32
33
34
TO
MODULATING
SIGNAL
SOURCE
38
40
29
14
22
A
16
26
24
12
18
28
20
36
10
42

CRYSTAL OSCILLATOR HAVING SPURIOUS OSCILLATION SUPPRESSION CIRCUIT

BACKGROUND

1. Field of Invention

This invention relates generally to oscillators, and more particularly to frequency modulated crystal controlled overtone oscillator circuits having means for preventing oscillations at undesired spurious responses of the crystal.

2. Prior Art

There are many applications wherein it is desirable to prevent an oscillator from oscillating at undesired frequencies. One such application is in a frequency modulated crystal controlled overtone oscillator wherein the modulation of the oscillator can cause the oscillator to switch to a spurious mode of operation.

Several techniques for reducing spurious oscillations are known. One such system employs tuned circuits to prevent oscillation at the undesired spurious modes, whereas another such technique utilizes a resistor in parallel with the crystal to introduce losses in the oscillator circuit to prevent oscillation at the undesired modes.

Whereas these techniques provide means for reducing spurious oscillations, the first technique is costly, requires precise adjustment and does not effectively remove spurious responses that are closely spaced in frequency to the desired frequency of operation. The second technique causes undesirable loading of the oscillator, and only reduces spurious responses that have an amplitude characteristic well below that of the desired oscillation frequency.

SUMMARY

It is an object of the present invention to provide an improved frequency modulated crystal oscillator providing modulation linearity and freedom from spurious oscillations.

It is another object of this invention to provide a frequency modulated crystal controlled oscillator that provides increased frequency deviation without spurious oscillations.

In accordance with a preferred embodiment of the invention, a resistance-inductance network is added to a Colpitts type oscillator. The values of the inductance and resistance are chosen to provide power dissipation at undesired spurious frequencies, and to allow only minimal losses to occur at the desired operating frequency. The gain of the oscillator circuit is selected to prevent oscillation at the undesired spurious frequencies at which the power loss is present.

DESCRIPTION OF THE DRAWING

In the drawing:

The single FIGURE is a detailed schematic diagram of a preferred embodiment of the oscillator according to the invention.

DETAILED DESCRIPTION

Referring to the drawing, the oscillator according to the invention comprises a first resonant circuit including a piezoelectric resonator, in this embodiment, a crystal 10, a voltage variable capacitor 12 and an inductor 14. A second resonant circuit comprises a second inductor 16 and a pair of feedback capacitors 18 and 20. The two resonant circuits are coupled together by means of the coupling capacitor 22, and are further coupled to the base of a transistor 24 by means of a coupling capacitor 26. A spurious power dissipating resistor 28 is connected between ground or common potential and the junction of the two resonant circuits at point A. The oscillator of the transistor 24 is connected to an output point 29, and a tuned circuit comprising an inductor 30 and a capacitor 32 which are also connected to the power supply A+. A capacitor 33 bypasses the power supply A+ to the ground or common potential for radio frequencies. The inductor 30 and capacitor 32 may be turned to the operating frequency of the crystal 10 or to a frequency multiple thereof. A resistor 34 is connected between the collector and base of the transistor 24 to forward bias the transistor. The emitter of the transistor 24 is connected to the junction of the capacitors 18 and 20 and to one terminal of a resistor 36, which has another terminal connected to ground or common potential. The modulating potential is applied to the voltage variable capacitor 12, which may be a semiconductor variable capacitance diode, from a modulation input point 38 via a resistor 40 and the inductor 14. An inductor 42 is connected across the crystal 10 to effectively tune out the static shunt capacitance of the crystal.

The values of the components are chosen such that at the desired operating frequency, for example, the third overtone of the crystal 10, which may be on the order of approximately 50 MHz, the inductor 14 is in series resonance with the variable capacitance diode 12. The crystal 10 may also be operated at its fundamental frequency or at other overtones. The component values are further chosen such that at the desired operating frequency, the inductor 16 is also at series resonance with the series combination of the capacitors 18 and 20. The series resonance of the aforementioned components causes a low impedance path to be present between ground and the junction point A of the capacitor 22 and inductor 16. The tuned circuit comprising inductor 30 and capacitor 32 may be tuned, for example, to the third harmonic of the operating frequency of the crystal 10, or approximately 150 MHz.

Because the impedance at point A is low, at the desired operating frequency, the dissipating resistor 28 connected between the point A and ground does not dissipate significant power at the desired operating frequency and the Q of the oscillator circuit is maintained at a high level. At spurious operating frequencies, the inductor 16 is no longer in series resonance with the series combination of the capacitors 18 and 20, and the inductor 14 is no longer in series resonance with the voltage variable capacitor 12, thereby causing the impedance at the point A to rise. When the impedance at the point A rises, the resistance of the resistor 28 becomes a significant portion of the total impedance between the point A and ground. This causes a sufficient amount of energy to be dissipated in the resistor 28 to prevent oscillation at the spurious frequencies.

The overall gain of the oscillator should be tailored such that the gain is sufficient to maintain oscillation when the resistor 28 is providing minimal loss at the desired operating frequency and such that the increase losses due to resistor 28 at spurious frequencies are sufficient to prevent oscillation. This may readily be accomplished by making the transconductance of the transistor amplifier approximately equal to the product of the square of the operating frequency in radians per second, the capacitance of the capacitor 18, the capacitance of the capacitor 20, and the total equivalent series resistance attributable to the two resonant circuits, excluding the resistor 28. In a typical circuit, the series resistance of the crystal 10 is approximately 50 ohms, and the total equivalent series resistance of the resonant circuits is approximately 100 ohms. In such a system, the typical range of the values for the resistor 28 would be on the order of 150 ohms to 500 ohms, with a range of 100 ohms to 1,000 ohms also providing satisfactory results.

Whereas a particular embodiment of the invention has been shown, it should be noted that any circuit employing the basic concepts of the embodiment described in the foregoing falls within the scope and spirit of the invention.

I claim:

1. A crystal controlled oscillator comprising:
a piezoelectric resonator having a predetermined operating frequency and other spurious operating frequencies;
inductance means and capacitance means connected in series with said piezoelectric resonator to form a first resonant circuit, said inductance means and said capacitance means being series resonant at said predetermined operating frequency;
second inductance means and second capacitance means connected in series to form a second resonant circuit, said second inductance means and said second capacitance means being series resonant at said predetermined operating frequency;
resistance means;
means connecting said resistance means in shunt with said first and second resonant circuits; and
amplifier means connected to one of said first and second resonant circuits for energizing said resonant circuits to oscillate at said predetermined operating frequency.

2. An oscillator as recited in claim 1 wherein said capacitance means included a voltage variable capacitor.

3. A crystal controlled overtone oscillator comprising:
a piezoelectric crystal having a predetermined overtone operating frequency and other spurious operating frequencies;
a first inductor and a first capacitor connected in series with said piezoelectric crystal to form a first resonant circuit, said first inductor and said first capacitor being series resonant at said predetermined operating frequency;
second and third capacitors connected together in series and a second inductor connected to said second capacitor in series with said second and third capacitors to form a second resonant circuit, said second inductor and said second and third capacitors being series resonant at said predetermined operating frequency;
a resistor;
means connecting said resistor in shunt with said first and second resonant circuits; and
an amplifier having input, output and common terminals, said input terminal being coupled to the junction of said second inductor and said second capacitor, and said common terminal being connected to the junction of said second and third capacitors.

4. A crystal controlled overtone oscillator as recited in claim 3 wherein said amplifier includes a transistor having base, emitter and collector electrodes, said input terminal being connected to said base electrode, said common terminal being connected to said emitter electrode, and said output terminal being connected to said collector electrode.

5. A crystal controlled overtone oscillator as recited in claim 4 wherein said first capacitor is a voltage variable capacitor.

6. A crystal controlled overtone oscillator as recited in claim 5 further including means for applying a modulating voltage to said voltage variable capacitor.

7. A crystal controlled overtone oscillator as recited in claim 6 further including a resonant circuit tuned to a predetermined harmonic of said predetermined overtone operating frequency connected to said output electrode.

8. A crystal controlled overtone oscillator as recited in claim 3 wherein said amplifier has a predetermined transconductance proportional to the square of the predetermined overtone operating frequency and the capacitance of said second and third capacitors.

9. A crystal controlled oscillator as recited in claim 3 wherein said first and second resonant circuits each have first and second terminals, said first terminal of said first resonant circuit being connected to the first terminal of said second resonant circuit to form a first junction, said second terminal of said first resonant circuit being connected to the second terminal of said second resonant circuit to form a second junction, said resistor being connected between said first and second junctions.

* * * * *